United States Patent [19]

Takahashi

[11] 4,135,162

[45] Jan. 16, 1979

[54] POWER AMPLIFIER CIRCUITS

[75] Inventor: Susumu Takahashi, Tokyo, Japan

[73] Assignee: Sansui Electric Co., Ltd., Tokyo, Japan

[21] Appl. No.: 840,600

[22] Filed: Oct. 11, 1977

[30] Foreign Application Priority Data

Oct. 12, 1976 [JP] Japan .................................. 51/122149

[51] Int. Cl.² .............................................. H03F 3/45
[52] U.S. Cl. .................................... 330/255; 330/257; 330/267
[58] Field of Search ................ 330/255, 257, 263, 267

[56] References Cited

U.S. PATENT DOCUMENTS 3,995,229  11/1976  Stehlin ............................. 330/255 X
4,021,746   5/1977  Suzuki .............................. 330/255 X Primary Examiner—James B. Mullins
Attorney, Agent, or Firm—Harris, Kern, Wallen & Tinsley

[57] ABSTRACT

A power amplifier circuit having a differential amplifier at an input stage and a following complementary symmetry circuit which is driven by a pair of opposite phase output signals of the differential amplifier as a push-pull circuit. One of the pair output signals is directly applied to a transistor of the complementary symmetry circuit and the other is applied to the other transistor of the complementary symmetry circuit through a phase-inverting transistor which forms a current mirror circuit together with a diode or a transistor being connected in the collector circuit of the transistor of the differential amplifier corresponding to the other output signal. So that the pair of opposite phase output signals are applied to two transistors of the complemeary symmetry circuit after being converted into in-phase signals. Because small current flows through the phase-inverting transistor similarly as transistors of the differential amplifier, a transistor of a small power capacity is used as the phase-inverting transistor. The power amplifier circuit is low in the cost, and the distortion, and is not affected by the ambient temperature variation and power source voltage variation.

5 Claims, 5 Drawing Figures

POWER AMPLIFIER CIRCUITS

BACKGROUND OF THE INVENTION

This invention relates to power amplifier circuits and in particular, to such circuits having a differential amplifier at an input stage and a complementary symmetry push-pull amplifier at an output stage.

As a power amplifier for audio-signals, a circuit has been well known wherein one or two differential amplifiers are used at an input stage, the output from the input stage being applied to complementary symmetry circuits for power amplification.

Referring to FIG. 1, an example of known power amplifiers comprises a differential amplifier $DA_1$, including a pair of FET transistors $Tr_1$ and $Tr_2$ to which an input signal and a fed-back signal are applied, respectively. Two opposite phase output signals from the differential amplifier $DA_1$ are applied to two inputs of another differential amplifier $DA_2$ including a pair of NPN transistors $Tr_3$ and $Tr_4$.

An output of the differential amplifier $DA_2$ is applied to a complementary symmetry circuit $CC_1$ including a pair of transitors $Tr_5$ and $Tr_6$ of opposite conductive types. In the shown circuit, a collector output of the NPN transistor $Tr_4$ is applied to a base electrode of the PNP transistor $Tr_5$ of the complementary symmetry circuit $CC_1$.

The other NPN transistor $TR_6$ of the circuit $CC_1$ is base-biassed at a constant voltage defined by a voltage divider constituted by resistors Ra and Rb. Thus, the transistor $Tr_6$ serves for a constant current means.

The output of the complementary symmetry circuit $CC_1$ is applied to two inputs of a complementary symmetry push-pull circuit $CC_2$ including a pair of transistors $Tr_7$ and $Tr_8$ of opposite conductive types, to which another complementary symmetry push-pull circuit $CC_3$ including a pair of transistors $Tr_9$ and $Tr_{10}$ is connected.

A power amplified output signal is obtained from the complementary symmetry circuit $CC_3$ at an output terminal OUT. A portion of the output signal is fed-back to the differential amplifier $DA_1$, as shown.

Diodes $BD_1$ are a biassing circuit from transistors $Tr_7$-$Tr_{10}$.

The differential amplifiers $DA_1$ and $DA_2$, the voltage divider, and the complementary symmetry circuits $CC_1$-$CC_3$ are connected in parallel with one another between a positive and a negative power lines which are connected to a positive and a negative power sources $+Vcc$ and $-Vcc$.

In the known power and amplifier circuit, only one output from the differentail amplifier $DA_2$ is used to drive the following complementary symmetry circuit $CC_1$ and one of the transistors, or $Tr_6$, of the complementary symmetry circuit $CC_1$ does not operate to amplify any signal.

On the other hand, a power amplifier circuit has been also used wherein both of two outputs of a differential amplifier are used as input signals to a following complementary symmetry circuit. An example of such power amplifier circuits is shown in FIG. 2.

Referring to FIG. 2, similar parts are respresented by same reference characters as in FIG. 1. The shown circuit is similar as the amplifier circuit in FIG. 1 except that not only one of the outputs of the differential amplifier $DA_2$ but also the other is coupled with the complementary symmetry circuits $CC_1$. Namely, one of the opposite phase outputs of the differential amplifier $DA_2$ is directly applied to the transistor $Tr_5$ of the complementary symmetry circuit $CC_1$, and the other is coupled with the transistor $Tr_6$ through a PNP transistor $Tr_{11}$ which is so provided to form a differential amplifier, together with the transistor $Tr_5$ of the complementary symmetry circuit $CC_1$. The base of the transistor $Tr_{11}$ is connected to the collector of the transistor $Tr_3$. The collector of the transistor $Tr_{11}$ is connected to the base of the transistor $Tr_6$ of the complementary symmetry circuit $CC_1$, and is connected to the negative power line through a diode $D_1$ and a resistor Rc.

In the circuit arrangement, the transistor $Tr_6$ and the diode $D_1$ form a current mirror circuit so that the current value $i_1$ on the collector circuit of the transistor $Tr_6$ may consist with the current $i_2$ on the collector circuit of the transistor $Tr_{11}$. Thus, the opposite phase output signals of the differential amplifier $DA_2$ are applied to the complementary symmetry circuit $CC_1$, after being converted into in-phase signals. Therefore, the complementary symmetry circuit $CC_1$ operates as a push-pull amplifier.

The use of opposite phase output signals from the differential amplifier $DA_2$ to operate the complementary symmetry circuit $CC_1$ as a push-pull amplifier is known to provide various advantages, for example, that the distortion of the output is reduced, that any variation and noise of a used power source do not present on the output and that the output drift depending on the ambient temperature is reduced.

However, the circuit arrangement as shown in FIG. 2 has a disadvantage in economical view point.

The transistor $Tr_{11}$ must be designated to permit flowing on its collector circuits a DC current of a same value as the transistor $Tr_5$, because both of those transistors form a differential amplifier and because the current mirror circuit is provided in the collector circuits of the both transistors $Tr_5$ and $Tr_{11}$.

Usually, DC current of about 10mA is required as the collector current $i_1$ of the transistor $Tr_5$. If the voltage of the power source Vcc is 50V, a transistor of a power capacity of 0.5W or more must be used for the transistor $Tr_5$.

Therefore, the transistor $Tr_{11}$ must be of a transistor having a power capacity of 1W or more, because the transistor $Tr_{11}$ is connected between a positive and a negative power sources $+Vcc$ and $-Vcc$ so that a voltage of about 100V ($= 2 \times Vcc$) is applied to the transistor $Tr_{11}$, and because the collector current $i_2$ of the transistor $Tr_{11}$ is equal to the current $i_1$ ($= 10mA$).

On the other hand, transistor $Tr_{11}$ must have a same property as the transistor $Tr_5$. The transistor $Tr_5$ must, also, have a same property as the transistor $Tr_6$ except the conductive type.

Accordingly, the use of the transistor $Tr_{11}$ requires the use of transistors of a larger power capacity than the necessary power capacity as transistors $Tr_5$ and $Tr_6$.

Furthermore, the complementary symmetry circuit $CC_1$ operates only as an A-class amplifier because the transistor $Tr_5$ forms a differential amplifier incorporating with the transistor $Tr_{11}$.

SUMMARY OF THE INVENTION

An object of this invention is to provide a power amplifier circuit which is low in the cost, less in the distortion and drift in the output, and less in the effect to the output by the variation and noise of a used power source.

Another object of this invention is to provide a power amplifier circuit having a differential amplifier to provide a pair of opposite phase output signals which are applied to a following complementary circuit to operate as a push-pull circuit, realizing above described object.

A power amplifier circuit of this invention comprises a differential amplifier at an input stage to provide a pair of opposite phase output signals. One of the pair signals is applied to a transistor of a complementary symmetry circuit at a following stage. The other signal is coupled to another transistor of the complementary symmetry circuit through a phase-inverting transistor. The phase-inverting transistor serves as a circuit element in a current mirror circuit which operates to maintain at a same value both a bias DC current flowing the phase-inverting transistor and a bias DC current flowing through one of transistor of the differential amplifier providing the output signal to the phase-inverting transistor. Thus, the opposite phase output signals are applied to transistors of the complementary symmetry circuit as in-phase signals and with reasonable bias voltages. Accordingly, the complementary symmetry circuit operates as a push-pull amplifier.

The mirror circuit comprises the phase-inverting transistor and a diode which is inserted between a power line and an output point from which the output signal applied to the phase-inverting transistor is obtained. The diode may be replaced by a transistor. In order to reduce a power capacity of the phase-inverting transistor, another transistor or a resistor may be connected in series with the phase-inverting circuit at the output side thereof.

These and further objects and features of this invention will be understood from following descriptions relating to preferred embodiments of this invention referring to the annexed drawings.

DETAILED DESCRIPTION OF PREFERRED EMBODIMENTS

Figure 1:
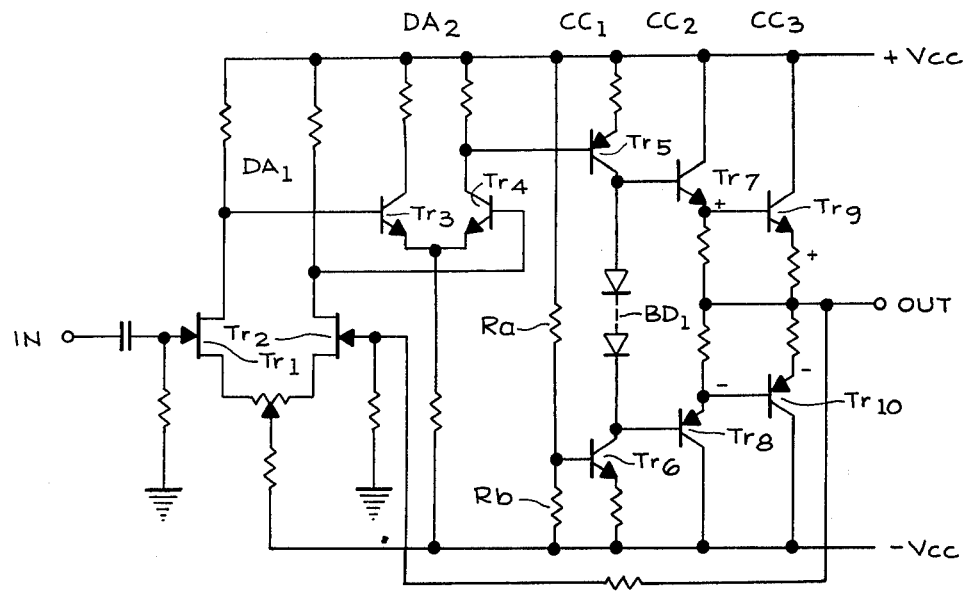
FIG. 1 shows a view of a circuit diagram of a known power amplifier.
Figure 2:
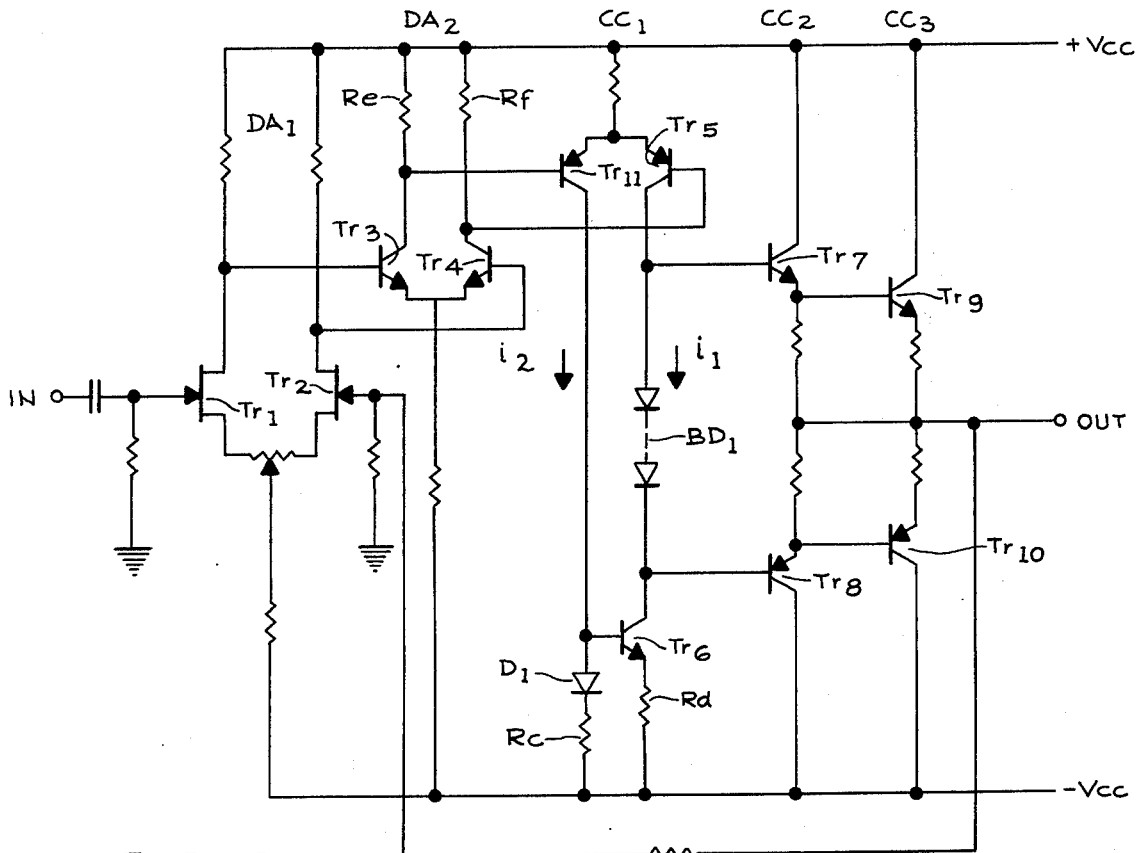
FIG. 2 shows a view of a circuit diagram of another known amplifier.
Figure 3:
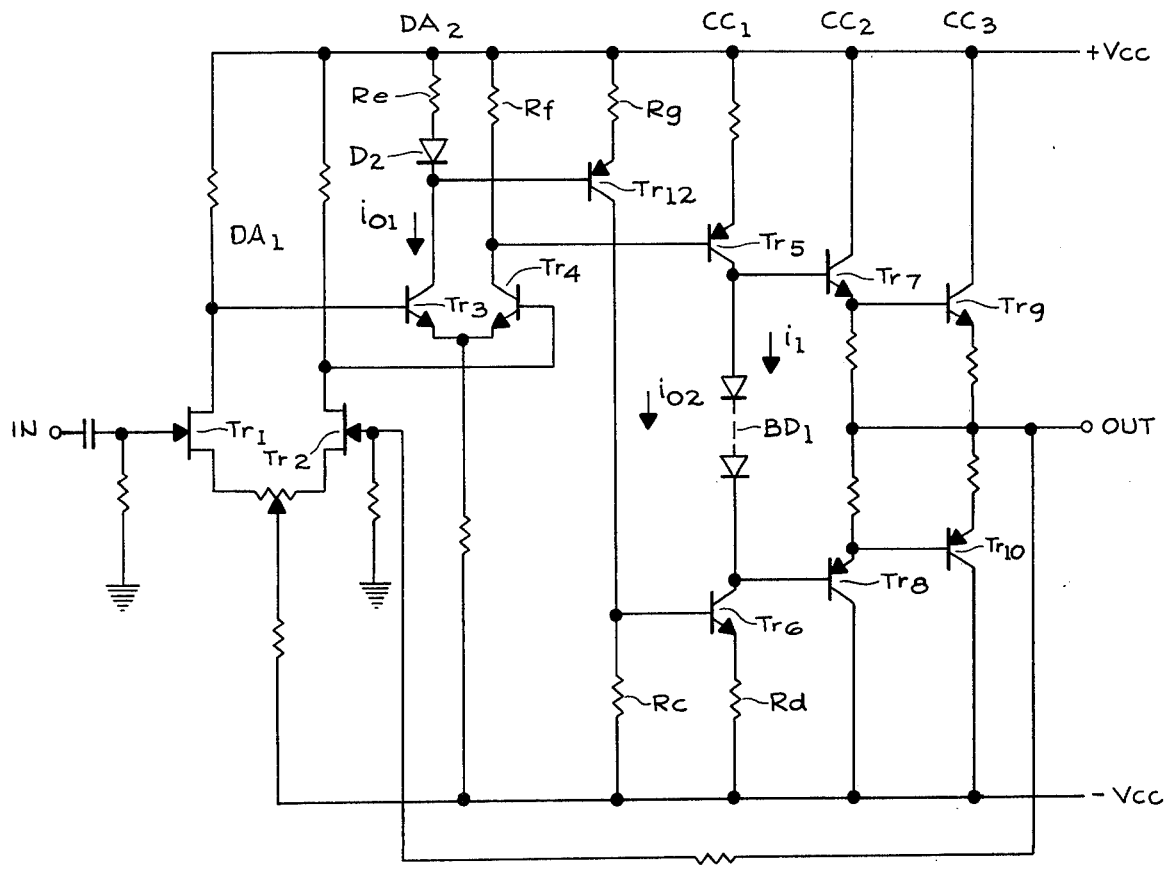
FIG. 3 shows a view of a circuit diagram of an embodiment of this invention.

FIG. 3 shows an embodiment of this invention. The shown embodiment is similar as the power amplifier in FIG. 1, except the circuit for applying one of outputs from a differential amplifier $DA_2$ to one of transistors of following complementary symmetry circuit $CC_1$ after phase-inverting, with the other signal being applied to the other transistor. Similar parts are represented by same reference characters as in FIG. 1, and descriptions are omitted.

Referring to FIG. 3, a diode $D_2$ is connected in series with a resistor Re to the collector of the transistor $Tr_3$ of the differential amplifier $DA_2$.

The collector of the transistor $Tr_3$ is connected with a base of a PNP transistor $Tr_{12}$ so that the output of the transistor $Tr_3$ is applied to the transistor $Tr_{12}$ to be phase-inverted.

The transistor $Tr_{12}$ is connected between a positive and negative power lines through resistors Rg and Rc. The collector of the transistor $Tr_{12}$ is connected to the base of the transistor $Tr_6$ of the complementary symmetry circuit $CC_1$ so that the phase-inverted signal is applied to the transistor $Tr_6$.

Diode $D_2$ and the phase-inverting transistor $Tr_{12}$ will be understood to form a current mirror circuit. Therefore, the collector current $i_{02}$ of the transistor $Tr_{12}$ is equal to the collector current $i_{01}$ of the transistor $Tr_3$.

The transistor $Tr_6$ is given a base-bias voltage by the resistor Rc through which the collector current $i_{02}$ flows. Accordingly, a signal of an opposite phase to the output signal of the transistor $Tr_3$ is applied to the transistor $Tr_6$ with a same amplitude.

On the other hand, to the transistor $Tr_5$, the output signal of the transistor $Tr_4$ of the differential amplifier $DA_2$ is applied, which is in opposite phase to the output signal of the transistor $Tr_3$ with a same amplitude.

Therefore, the complementary symmetry circuit $CC_1$ of the pair transistors $Tr_5$ and $Tr_6$ operates as a push-pull circuit, since in-phase signals are applied to those transistors.

Collector current of each transistor of the differential amplifier $DA_2$ is, usually, selected about 1mA or less. Therefore, a transistor of a small power capacity of, for example, such as 100mW can be used for the phase-inverting transistor, as well as the transistors $Tr_3$ and $Tr_4$.

Therefore, according to this embodiment, a power amplifier circuit is realized with a lower cost wherein a pair of opposite phase output signals from a differential circuit are applied to a pair of transistors of following complementary symmetry circuit to operate it as a push-pull amplifier.

The collector current $i_{02}$ of the transistor $Tr_{12}$ is equalized to the collector current $i_{01}$ of the transistor $Tr_3$. The collector currents of both transistors $Tr_3$ and $Tr_4$ of the differential amplifier are equal to one another but opposite in the phase. Therefore, it is desirable that the collector resistors Re, Rf and Rc of the transistors $Tr_3$, $Tr_4$ and $Tr_{12}$ and the emitter resistor Rg of the transistor $Tr_{12}$ are equal to one another in the value.

As will be noted from above description, the complementary symmetry circuit $CC_1$ is able to be made to operate as a B-class amplifier because any transistors of the complementary symmetry circuit forms no differential amplifier together with any other transistor.

Figure 4:
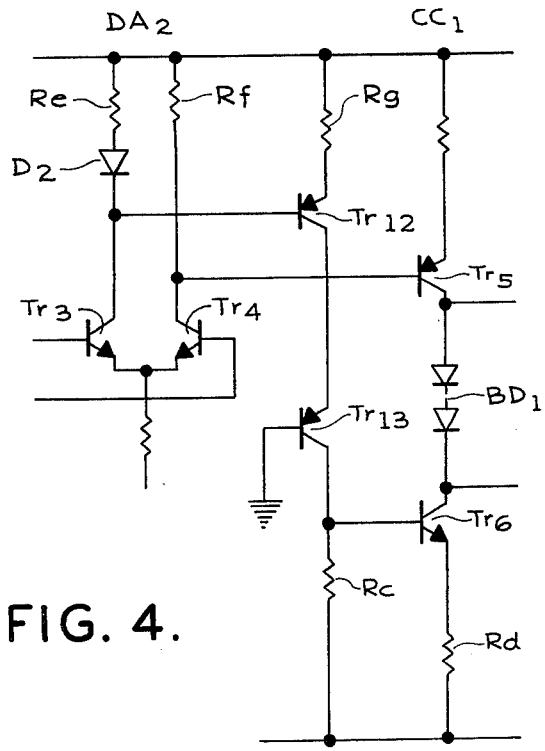
FIG. 4 shows a view of a circuit diagram of a modified embodiment.

Referring to FIG. 4, in which a modification is partially shown, a transistor $Tr_{13}$ is connected in the collector circuit of the phase-inverting transistor $Tr_{12}$, with the base thereof being grounded.

According to this modification, it is possible to compensate a small power capacity of the transistor $Tr_{12}$ by the transistor $Tr_{13}$. And, therefore, it is possible to use transistors of smaller power capacities for the transistors $Tr_{12}$ and $Tr_{13}$.

It will be clearly understood that a resistor may be used in place of the transistor $Tr_{13}$ to realize a similar purpose.

Figure 5:
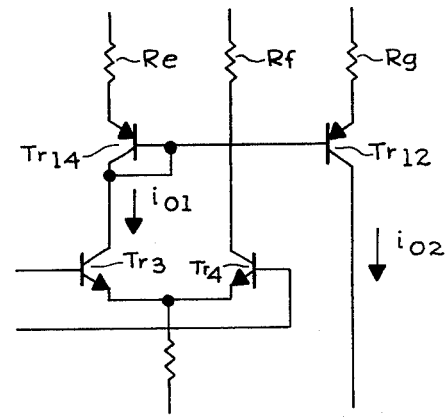
FIG. 5 shows a view of a circuit diagram of another modification.

FIG. 5 shows a circuit diagram of a main portion of another modification. The modification is similar as the embodiment in FIG. 3 except that a PNP transistor $Tr_{14}$ is used in place of the diode $D_2$ in FIG. 3 and FIG. 4. As shown, the base of the transistor $Tr_{14}$ is directly connected to the collector thereof which is, in turn, connected to the output point of the transistor $Tr_3$.

As will be noted, the transistors $Tr_{14}$ and $Tr_{12}$ form a current mirror circuit.

Since the above embodiments are for exemplification, the used transistors are of transistors of specific conductive types. It will be noted that similar circuits may be easily made with the use of respective transistors of opposite conductive types, and also with the use of FET transistors except the current mirror circuit.

This invention has been described in conjunction with specific embodiments, but it will be noted to those skilled in the art that various modifications and various other designations may be easily made within the spirit of this invention.

What is claimed is:

1. In a power amplifier circuit including a differential amplifier having a pair of first and second transistors connected between positive and negative power lines, a complementary symmetry circuit having a pair of third and fourth transistors of opposite conductive type connected between said positive and negative power lines, with said third transistor directly connected to an output point of said first transistor thereby to drive said third transistor directly by a first output voltage signal of said differential amplifier, and a bias circuit for said fourth transistor comprising voltage dividing resistors connected between said positive and negative power lines, an improvement comprising, a fifth transistor directly connected to an output point of said second transistor to be driven by a second output signal in phase opposition to said first output signal of said differential amplifier, said fifth transistor being connected between said voltage dividing resistros in series therewith to phase-invert said second output signal and to couple said second output signal with said fourth transistor, and means for equalizing a current flowing through said fifth transistor with a current flowing through said second transistor to equalize the amplitude of the voltage signal applied to said fourth transistor with the amplitude of said first output voltage signal applied to said third transistor whereby said third and fourth transistors may operate as a push-pull amplifier.

2. The improvement as claimed in claim 1, wherein said current equalizing means comprises a diode which is so connected in series with said second transistor at the output side thereof that said second output signal is taken out at a point between said diode and said second transistor, said diode and said fifth transistor forming a current mirror circuit.

3. The improvement as claimed in claim 1, wherein said current equalizing means comprises a sixth transistor which is so connected in series with said second transistor at the output side thereof that said second output signal is taken out at a point between said sixth transistor and said second transistor, a control electrode of said sixth transistor being directly connected with a carrier deriving electrode thereof, said sixth transistor and said fifth transistor forming a current mirror circuit.

4. The improvement as claimed in claim 1, which further comprises a resistor means which is connected in series with said fifth transistor to share the power with said fifth transistor, said fifth transistor being of a transistor having a reduced power capacity.

5. The improvement as claimed in claim 4, wherein said resistor means is of a transistor having a base being grounded.

* * * * *